(12) United States Patent
Makino

(10) Patent No.: US 7,219,323 B2
(45) Date of Patent: May 15, 2007

(54) SYSTEMS AND METHODS FOR WIRING CIRCUIT COMPONENTS

(75) Inventor: Eiichi Makino, Round Rock, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 28 days.

(21) Appl. No.: 11/107,038

(22) Filed: Apr. 15, 2005

(65) Prior Publication Data

US 2006/0236290 A1 Oct. 19, 2006

(51) Int. Cl.
*G06F 17/50* (2006.01)
(52) U.S. Cl. .................. 716/10; 716/8; 716/9
(58) Field of Classification Search .............. 716/8–12
See application file for complete search history.

(56) References Cited

U.S. PATENT DOCUMENTS

| | | | |
|---|---|---|---|
| 6,505,332 B1* | 1/2003 | Oda | 716/12 |
| 6,643,838 B2* | 11/2003 | Rarick | 716/13 |
| 7,032,205 B2* | 4/2006 | Kato | 716/11 |
| 2001/0004763 A1* | 6/2001 | Kato | 716/11 |
| 2005/0216876 A1* | 9/2005 | Proebsting et al. | 716/12 |

FOREIGN PATENT DOCUMENTS

| | | |
|---|---|---|
| JP | PH07-153844 | 6/1995 |
| JP | PH10-308451 | 11/1998 |

\* cited by examiner

*Primary Examiner*—Jack Chiang
*Assistant Examiner*—Binh Tat
(74) *Attorney, Agent, or Firm*—Law Offices of Mark L. Berrier

(57) ABSTRACT

Systems and methods for arranging parallel wires to reduce the capacitance variations. In one embodiment, multiple first components arranged as a linear array are coupled to a second component at the end of this linear array by corresponding signal wires. Each signal wire has a perpendicular portion extending perpendicular to the direction of the linear array, and a parallel portion which runs parallel to the direction of the linear array. The parallel portions are staggered so that longer ones of the parallel portions are adjacent to the shorter ones of the parallel portions, instead of simply being arranged from longest to shortest. In one embodiment, the longer half of the parallel portions decrease in length across the series of parallel portions, while the shorter half of the parallel portions increase in length. In another embodiment, successively longer/shorter parallel portions alternate sides of the series.

19 Claims, 8 Drawing Sheets

SYSTEMS AND METHODS FOR WIRING CIRCUIT COMPONENTS

BACKGROUND

1. Field of the Invention

The invention relates generally to electronic circuits, and more particularly to systems and methods for laying out wiring between a first set of circuit components and a second component.

2. Related Art

With advancements in electronics technology, there is constantly a demand for improved electronic devices. Aside from the demand for new features in these devices, there is a demand to make the same devices smaller and faster. In order to make electronic devices smaller and faster, it is normally necessary to make the components that form the devices physically smaller. Decreasing the size of these components, however, can result in problems that prevent the devices from operating more quickly, and may even cause the devices to malfunction.

As the size of electronic components decreases, the size and spacing (pitch) of the wires connecting these components also decreases. As the pitch of the wires in an electrical circuit decreases, the coupling capacitance of these wires increases. The increased coupling capacitance in turn results in increased interference between the wires. Additionally, as the complexity of the electronic circuits increases, longer wires (and more widely varying lengths of wires) may be necessary to connect individual components within the circuit. The increased length of the wires results in increased resistance on these wires.

The increased capacitance and resistance of wires in electrical circuits may lead to some signal paths being effectively longer than others. In other words, it may take longer for a signal to traverse a path over a wire with higher resistance and capacitance than a path over a wire with lower resistance and capacitance. This is problematic in circuits which couple signals from a large number of components into another component because it is difficult to keep the signal paths the same length. As a result, it may take different amounts of time for the signals to reach the end component, and the phases of the signals may consequently become skewed with respect to each other. Further, because the capacitance is greatest in the longest signal lines, the increased time necessary to traverse the longest signal lines forces the circuits to be operated at slower speeds.

Conventionally, the problems caused by the capacitance between the signal lines is addressed in either of two ways. First, the width of the wires may be increased in order to reduce their resistance. By reducing the resistance of the wires, the signal paths are effectively shortened and less skew results from the signals traversing the different signal paths. The second way the problem is addressed is by increasing the pitch of the wires. In other words, the spacing of the wires is increased. By increasing the pitch of the wires, the coupling capacitance between the wires is decreased. The decreased capacitance result in reduced interference and less skew between the signals.

The problem with these conventional solutions to the problem is that, by increasing the width of the wires or by increasing the spacing between the wires, the size of the circuit is increased. This goes against the desired reductions in size. It would therefore be desirable to provide systems and methods for reducing the skew between signal lines without increasing the size of the circuit in which the signal lines are used.

SUMMARY OF THE INVENTION

One or more of the problems outlined above may be solved by the various embodiments of the invention. Broadly speaking, the invention includes systems and methods for arranging parallel wires to reduce the capacitance variations among the wires and to thereby reduce the skew of the signals on the different wires and the time required for signals to traverse the wires.

In one embodiment, multiple first components, such as buffers or latches are coupled to a second component, such as an encoder, or error correction logic. The first components are physically arranged as a linear array. The second component is positioned at the end of this linear array. Each of the first components is coupled to the second component by a wire that has a perpendicular portion extending perpendicular to the direction of the linear array, and a parallel portion which runs parallel to the direction of the linear array. Rather than positioning the parallel portions of adjacent ones of the first components next to each other, the parallel portions are staggered so that the parallel portions of the wires are not adjacent to those of adjacent components. Thus, instead of having the longest parallel portion adjacent to the next longest parallel portion, the longest parallel portion is adjacent to a much shorter parallel portion. As a result, the two adjacent parallel portions are only adjacent for the length of the shorter of the two. The remainder of the longer parallel portion is twice as far away from the next wire (effectively twice the wire pitch.)

One embodiment comprises a system including a linear array of first components, a second component positioned adjacent to the linear array of first components, and a plurality of signal lines. Each signal line is coupled between a corresponding one of the first components and the second component. Each signal line includes a parallel portion that is parallel to the linear array of first components and has a corresponding length. The signal lines are positioned so that adjacent signal lines are staggered according to the corresponding parallel portion lengths. In one embodiment, the signal lines are arranged with the signal line having the nth longest parallel portion is adjacent to the signal line having the nth shortest parallel portion. The parallel portions may be positioned with the lengths of the long parallel portions decreasing from a first side of a series to a second side and the lengths of the short parallel portions increasing from the first side to the second side. Alternatively, long parallel portions may be positioned with successively decreasing lengths on alternating sides of the series. Short parallel portions would then be positioned with successively increasing lengths on alternating sides of the series as well.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
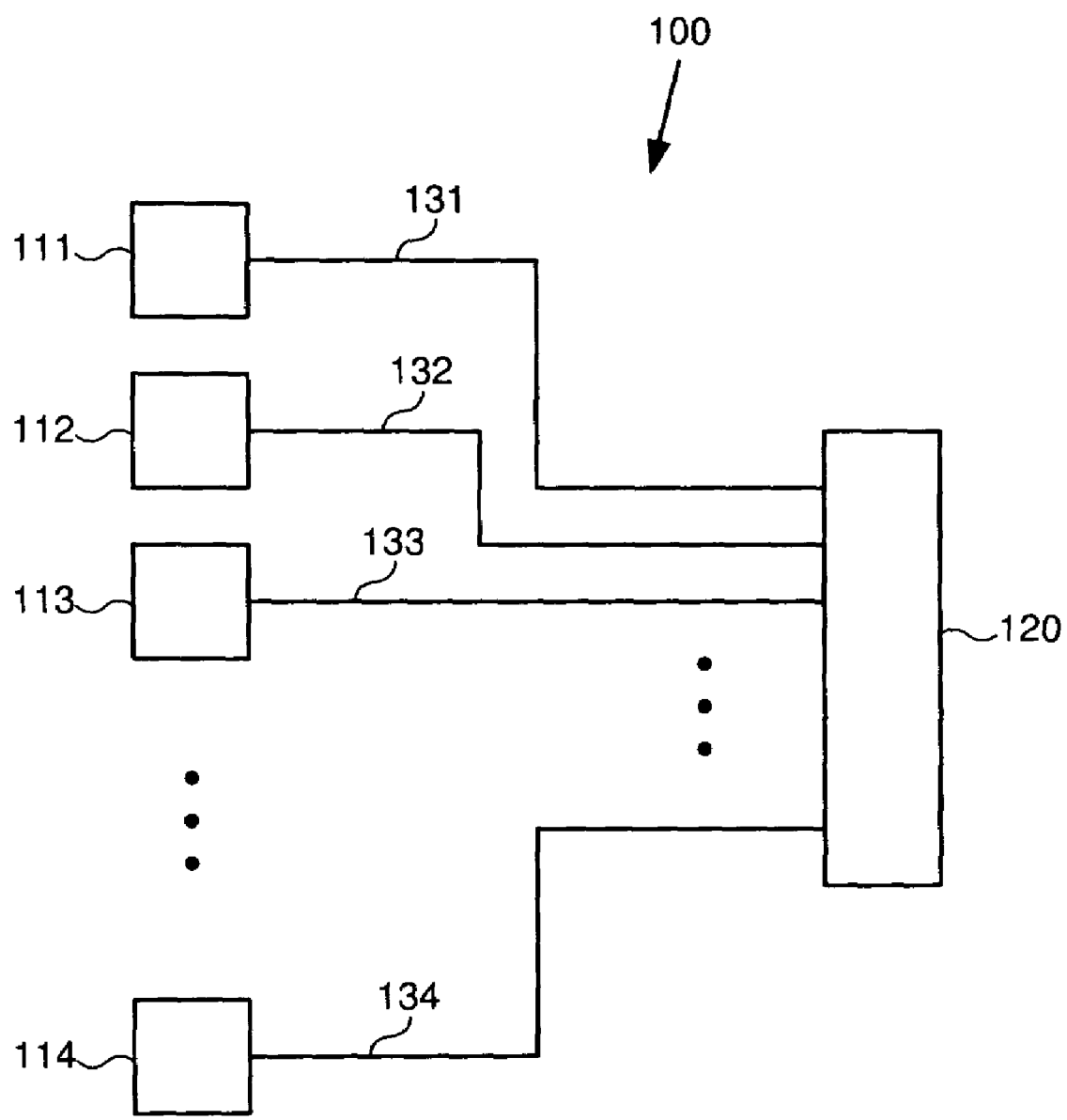
FIG. 1 is a diagram illustrating an exemplary circuit.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for arranging parallel wires to reduce the capacitance variations among the wires and to thereby reduce the skew of the signals on the different wires and the time required for signals to traverse the wires.

In one embodiment, multiple first components, such as buffers or latches are coupled to a second component, such as an encoder, or error correction logic. The first components are physically arranged as a linear array. The second component is positioned at the end of this linear array. Each of the first components is coupled to the second component by a wire that has a perpendicular portion extending perpendicular to the direction of the linear array, and a parallel portion which runs parallel to the direction of the linear array. Rather than positioning the parallel portions of adjacent ones of the first components next to each other, the parallel portions are staggered so that the parallel portions of the wires are not adjacent to those of adjacent components. Instead, long ones of the parallel portions are staggered with short ones of the parallel portions. By alternating long and short parallel portions, the signal lines effectively have twice (2×) the pitch over a portion of the lengths of the long parallel portions. (The short parallel portions have 1× pitch over their entire lengths.) This configuration slightly increases the capacitance of the signal lines having the short parallel portions (which normally have the lowest capacitance) and significantly reduces the capacitance of the signal lines having the long parallel portions (which normally have the highest capacitance.) The capacitance variation among the signal lines (and resulting signal skew) is thereby reduced. Further, the capacitance of the longest signal lines is reduced the most, thereby reducing the corresponding time needed for signals to traverse these signal lines and allowing the circuits to be operated at higher speeds.

Before describing the embodiments of the invention in detail, it may be useful to describe the types of circuits in which various embodiments can be used, as well as the problems that are to be solved. Referring to FIG. 1, a diagram illustrating an exemplary circuit is shown. In this circuit, there are multiple components 111–114 on the left side of the figure. All of components 111–114 are of a first type. Each of components 111–114 is coupled to a second component 120 by corresponding signal line 131–134.

Circuit 100 may, for example, be a part of an error correction circuit, bus circuit, or various other circuits. Whatever the purpose of the circuit, there may be many of the first type of component (111–114,) all of which are providing signals on corresponding signal lines (131–134) to a single component (120.) In order to manufacture circuit 100 (and any other circuits to which it is coupled,) it is necessary to determine the physical layout of the components and signal lines. While the layout depicted in FIG. 1 is simple, easy to follow and corresponds conceptually to the flow of data from components 111–114 to component 120, this layout is not very efficient in terms of the space used by the circuit. It is also easy to see that, as the number of components of the first type increases, the amount space required for the circuit quickly grows. Because the cost of materials and the cost of processing these materials to produce integrated circuits are high, a more space-efficient design would be preferred.

As noted above, circuit 100 may be an error correction circuit. These circuits may, for example, consist of a tree of XOR gates. In other words, a first set of signals are input to a first XOR gate, a second set of signals are input to a second XOR gate, and so on. These XOR gates form a first tier. The output of each of these XOR gates is then input to one of a second tier of XOR gates, and the outputs of the second tier of XOR gates is input to one of a third tier of XOR gates, and so on, until a single error correction signal is generated. If circuit 100 is an XOR tree of this type, the XOR gates in the first tier are the first component (111–114,) while the second and subsequent tiers collectively form the second component (120.)

Figure 2:
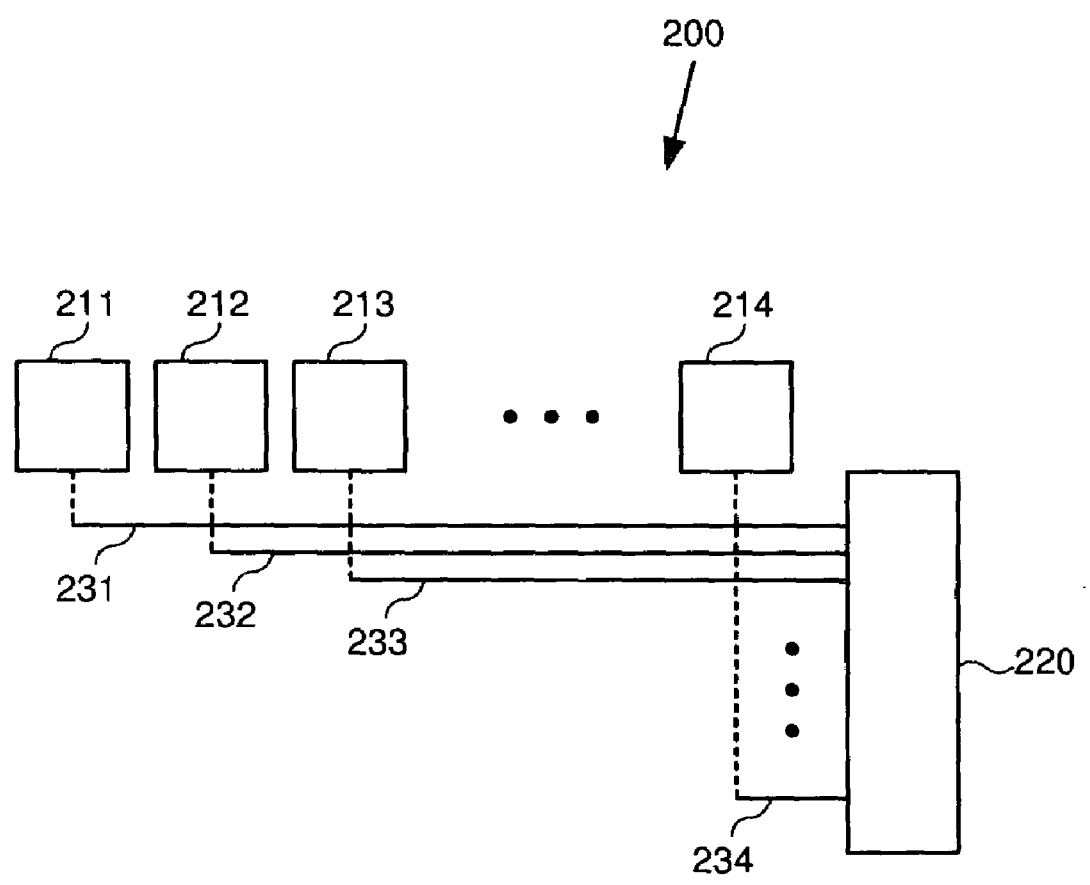
FIG. 2 is a diagram illustrating a conventional circuit layout that makes more efficient use of the available space on a chip.

Referring to FIG. 2, a diagram illustrating a conventional circuit layout that makes more efficient use of the available space on a chip is shown. In this figure, circuit 200 consists of a set of first components 211–214 (which may be the same components as 111–114) and a second component 220 that are coupled together by a set of signal lines 231–234. In circuit 200, first components 211–214 are positioned in a linear array. That is, all of these components are aligned (horizontally in the figure.) The second component, 220, is positioned at one end of the linear array.

The signal line that couples each first component to the second component has a first portion that extends perpendicular to the linear array (downward in the figure,) and a second portion that extends parallel to the linear array (horizontally to the right in the figure.) The first, perpendicular portion of each signal line may be formed in a first layer of the circuit, while the second, parallel portion each signal line may be formed a second layer. The circuit layout depicted in FIG. 2 provides a very compact and simple configuration for the circuit. First components 211–214 are positioned closely together so that little space goes unused in the linear array. Similarly, signal lines 231–234 are positioned closely together so that there is little wasted space between the signal lines.

As noted above, however, each of the signal lines has a corresponding capacitance. This capacitance includes a first component corresponding to the capacitance that is developed between one signal line and adjacent signal lines, and a second component corresponding to the capacitance developed between the signal line and ground. The first kind of capacitance is referred to as coupling capacitance, and the second type of capacitance is referred to as loading capacitance.

When signal lines are positioned very closely together, as shown in FIG. 2, the coupling capacitance can be substantial. The closer the signal lines are to each other (i.e., the smaller the pitch of the signal lines,) the greater the coupling capacitance between them. Thus, as the pitch of the signal lines decreases, the capacitance of the signal lines increases as well. As explained above, when the capacitance of a signal line increases, the effective path length of the signal line increases, potentially affecting the timing of signals on the line.

It should be noted that the perpendicular portions of the signal lines typically are not as closely spaced as the parallel portions. The parallel portions therefore make greater contributions to the signal lines' total capacitance than the perpendicular portions.

In a circuit such as the one illustrated in FIG. 2, the parallel portions of the signal lines have varying lengths. Because capacitance is developed along each portion of the line (i.e., because each portion of the line makes some contribution to the capacitance,) longer lines develop more capacitance than shorter lines, all else being equal. The greater capacitance of the longer signal lines adds to their effective signal path lengths, which are already longer than those of the shorter signal lines. This leads to greater disparity between the signal path lengths of longer and shorter signal lines, and consequently greater skew between the signals of the longer and shorter signal lines. Additionally, because the longest signal lines take the longest for signals to traverse, these lines limit the speed with which the circuit can be operated. When the signal path lengths of the longest signal lines are increased due to capacitance, the maximum operating speed of the circuit is reduced.

This normal tendency of longer signal lines to have greater capacitance and slower, skewed signals with respect to shorter signal lines can be aggravated by the physical positioning of the difference signal lines. As noted above, the parallel portions of the signal lines in FIG. 2 have different lengths. More specifically, the parallel portions of the signal lines are arranged in the order of their lengths. That is, the longest parallel portion is adjacent to the second longest, which is adjacent to the third longest, and so on. Likewise, the shortest parallel portion is adjacent to the second shortest, which is adjacent to the third shortest, and so on. Because the long signal lines have other long signal lines positioned immediately adjacent to them, they pick up coupling capacitance along almost their entire lengths. These signal lines therefore have greater coupling capacitance than if they were not positioned next to these other lines.

Conventionally, this problem is resolved by simply increasing the pitch of the signal lines. That is, the spacing between the signal lines is increased. The pitch of the signal lines might, for example, be increased by two times. By increasing the spacing between the signal lines, the coupling capacitance that is developed between these lines and adjacent lines is reduced. This solution, however, is not ideal because it requires that the circuit occupy more space on the chip. If, for instance, the signal lines of circuit 200 require a space that is 1× wide (high in the figure,) a circuit having twice the pitch would require a space that is 2× wide.

Various embodiment of the invention resolve this problem by maintaining the pitch of the signal lines, but staggering the signal lines. That is, the signal lines are positioned in an alternating series of long and short parallel portions. It should be noted that, for the purposes of this disclosure, "long" refers to those signal lines which have a parallel portion that is longer than the median length of all of the parallel portions. Similarly, "short" refers to those signal lines which have a parallel portion that is shorter than the median length.

Figure 3:
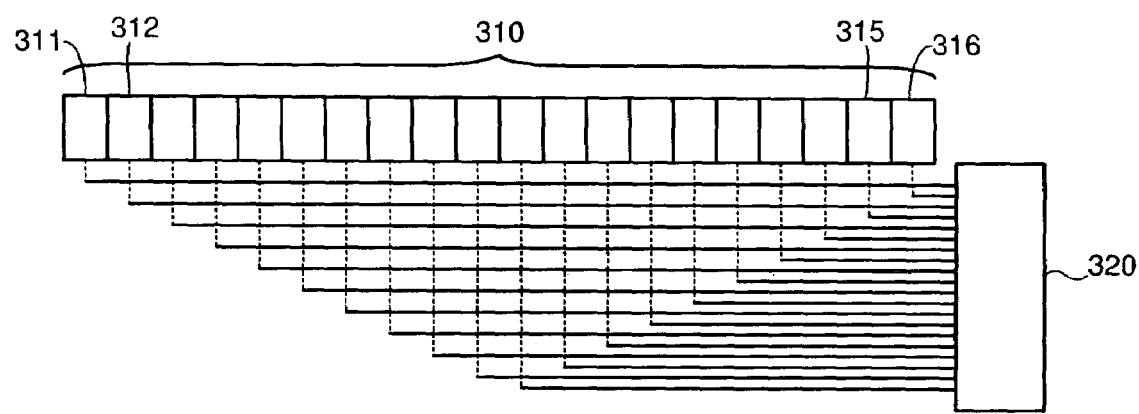
FIG. 3 is a circuit having signal lines positioned according to a first exemplary embodiment.

Referring to FIG. 3, a circuit having signal lines positioned according to a first exemplary embodiment is shown. In this figure, the set of first components 310 is again arranged in a linear array. Second component 320 is positioned at one end of the array. Each of the first components is coupled to the second component by a corresponding signal line.

It can be seen that the signal line corresponding to component 311 has the longest parallel portion, the line corresponding to component 312 has the second longest parallel portion, and so on. Conversely, component 316 has the signal line with the shortest parallel portion, component 315 has the second shortest parallel portion, and so on. In the embodiment of FIG. 3, the nth longest parallel portion is adjacent to the nth shortest parallel portion, and the nth and (n+1)th longest (shortest) parallel portions are separated by a single short (long) parallel portion. Thus, the parallel portions of the signal lines are positioned in the following order:

longest;
shortest;
second longest;
second shortest;
third longest;
. . .
or
shortest;
longest;
second shortest;
second longest;
third shortest;
. . .

In this embodiment, the long parallel portions have increasing lengths from one side to the other of the series of parallel portions. Similarly, the short parallel portions have decreasing lengths in the same direction across the series of parallel portions.

As a result of this configuration, an increased pitch is achieved for some part of the longer parallel portions. For example, the parallel portion coupled to component 311 has a 2× pitch over most of its length, and a 1× pitch over a portion of its length equal to the length of the parallel portion coupled to component 316. With each successive one of the long parallel portions, the ratio of 2× pitch length to 1× pitch length decreases.

The effect of this staggered long-short positioning of the parallel portions of the signal lines causes the coupling capacitance of the longer parallel portions to be reduced. The reduction is greatest for the longest parallel portion, and decreases as the length of the parallel portion decreases. For short parallel portions (those which are no longer than the median parallel portion,) the coupling capacitance is not reduced. In fact, the coupling capacitance may be slightly increased because, rather than being positioned between one parallel portion that a shorter and one parallel portion is longer, the parallel portion under consideration is now positioned between two longer parallel portions, which slightly increases the coupling capacitance. In terms of signal skew, however this is advantageous because it is desirable to have the same effective signal path lengths for all of the signal lines, so it is helpful to minimize the difference between the longest and shortest signal path lengths, rather than to simply minimize the longest signal path length. Also, because the time required to traverse the longest signal lines limits the operating speed of the circuit, the reduction of the signal path lengths for these lines is desirable, even in the absence of skew reduction.

Figure 4:
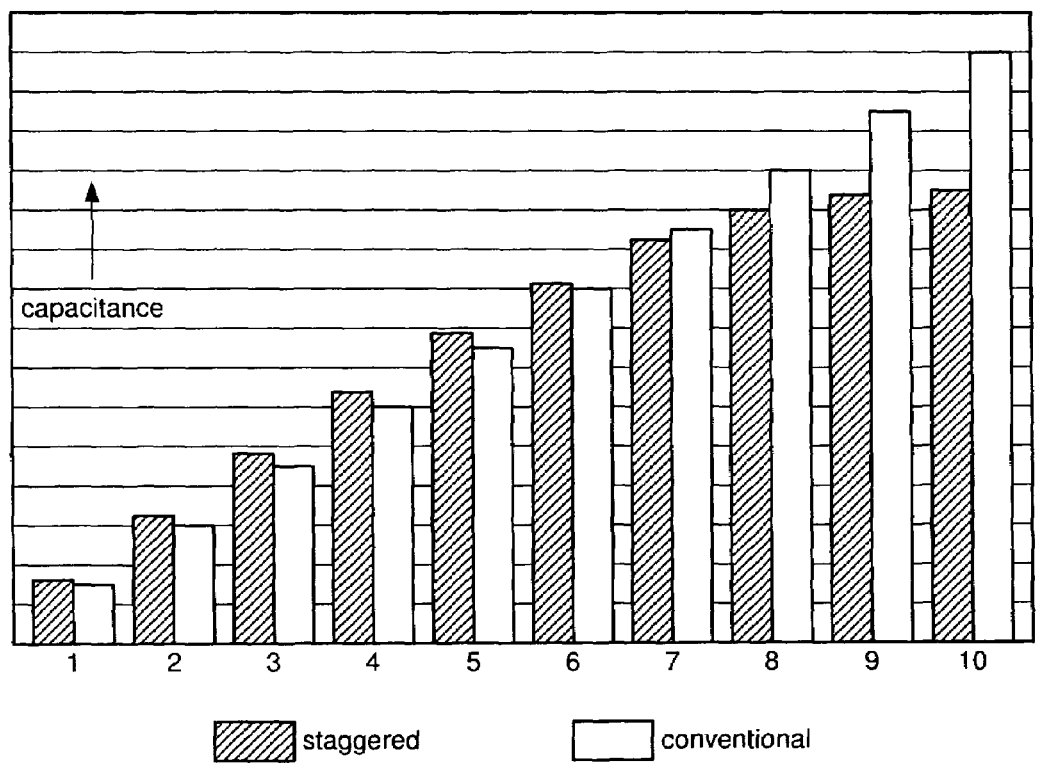
FIG. 4 is a bar graph illustrating the change in capacitance for sets of signal lines arranged conventionally and in a staggered configuration in accordance with one embodiment.

Referring to FIG. 4, a bar graph illustrating the change in capacitance for sets of signal lines arranged conventionally and in a staggered configuration in accordance with one embodiment is shown. FIG. 4 corresponds to a pair of circuits that each have ten signal lines. The line having the shortest parallel portion is identified as 1, while the line having the longest parallel portion is identified as 10. One of the circuits has the parallel portions of the signal lines arranged conventionally (in length-order,) similar to the circuit shown in FIG. 2. The other circuit has the parallel portions of the signal lines arranged in a staggered fashion, similar to the circuit shown in FIG. 3.

It can be seen in FIG. 4 that the capacitance of the signal lines increases roughly linearly for the conventional circuit. The capacitance of the signal lines in the staggered circuit, on the other hand, increases relatively linearly for the lines having the shorter parallel portions (1–5,) but then increases more slowly for the signal lines having the longer parallel portions. As described above, the capacitance of the signal lines having the shorter parallel portions is slightly higher in the staggered configuration, and the capacitance of the lines having the longer parallel portions is lower in the staggered configuration. In the case of the longest parallel portion (line 10,) the capacitance is significantly lower than in the conventional configuration. The capacitance variation among the signal lines is therefore lower in the staggered configuration than in the conventional configuration.

Figure 5:
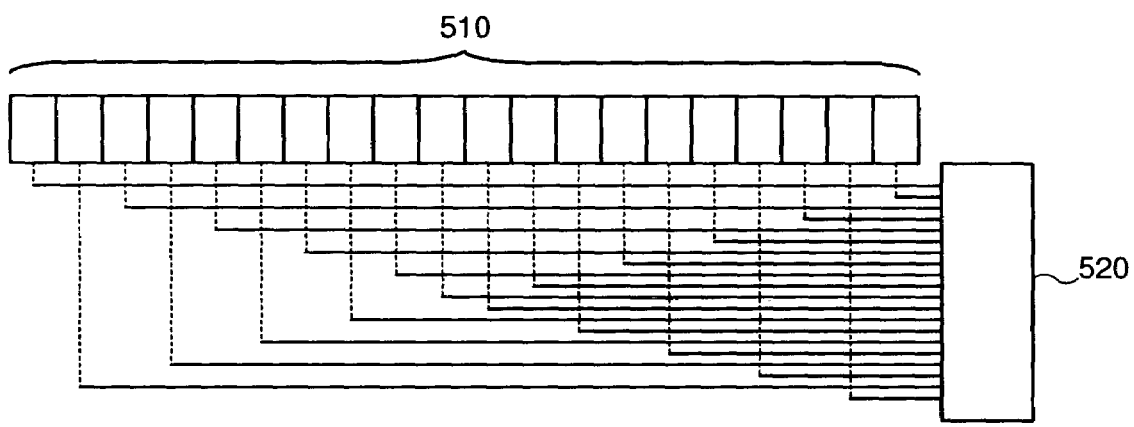
FIG. 5 is a diagram illustrating a circuit having signal lines positioned according to an alternative embodiment.

Referring to FIG. 5, a diagram illustrating a circuit having signal lines positioned according to an alternative embodiment is shown. In FIG. 5, a first set of components 510 is arranged in a linear array, just as in FIG. 3. Similarly, a second component 520 is positioned at the end of the linear array. Each of the first components is coupled to the second component by a corresponding signal line having a perpendicular portion and a parallel portion (as defined above.)

The circuit of FIG. 5 differs from the circuit of FIG. 3 in that the long parallel portions are not only staggered with short parallel portions, but also are positioned with successively longer/shorter parallel portions on alternating sides of the series of parallel portions. That is, rather than positioning the longest parallel portion, then the shortest, then the second longest, then the second shortest, and so on, adjacent to each other from one side of the series of parallel portions to the other, a pair of long and short parallel portions is placed on one side of the series, then the next pair is placed on the other side of the series, with successive pairs alternating sides until the series is completely positioned. Put another way, the nth longest parallel portion is adjacent to the nth shortest parallel portion, and the nth and (n+2)th longest (shortest) parallel portions are separated by a single short (long) parallel portion. The parallel portions of the signal lines are therefore positioned in the following order:

longest;
shortest;
third longest;
third shortest;
. . .
fourth longest;
fourth shortest;
second longest;
second shortest.

It should be noted that the series of staggered parallel portions may begin with either a long parallel portion as described above, or a short parallel portion. In one alternative embodiment, a static line such as a ground wire may be positioned next to the series of parallel portions. In this case, it may be desirable to position the parallel portions so that the longest parallel portion is adjacent to the static line, in order to minimize the coupling capacitance on the corresponding signal line. If there is no static line adjacent to the series of parallel portions, it may be desirable to begin the series with a short parallel portion.

It should be noted that the use of particular types of components in the circuits described herein is not important. In one embodiment, the first components may be buffers or latches that provide data to an encoding circuit (the second component.) In other embodiments, the first and second components may be different. These components may be individual circuit components or logic gates, or they may be circuits containing multiple components.

Figure 6:
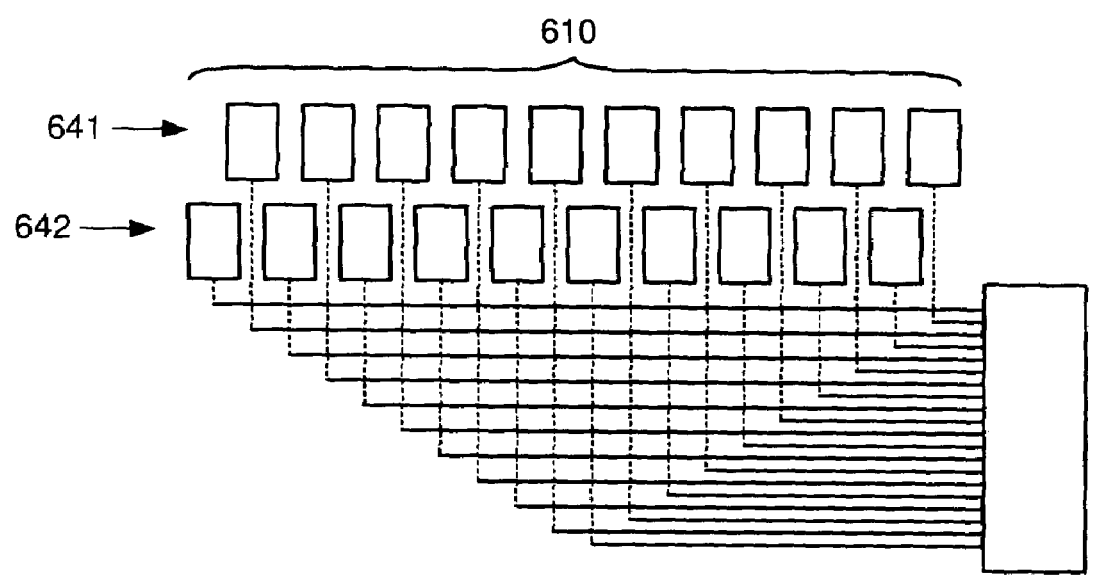
FIG. 6 is a diagram illustrating a circuit having signal lines positioned according to another alternative embodiment.

It should also be noted that alternative embodiments may have different component topologies. That is, the first and second components may be physically arranged in a different manner than described in the circuits above. For example, the linear array of first components may consist of a set of components that are not all positioned in a single line. These components may alternatively be staggered so that they are in multiple rows. An example of this component topology is shown in FIG. 6. First components 610 are shown in two rows, 641 and 642. It should be noted that the parallel portions of the signal lines are staggered in the same manner as the circuit of FIG. 3.

Figure 7:
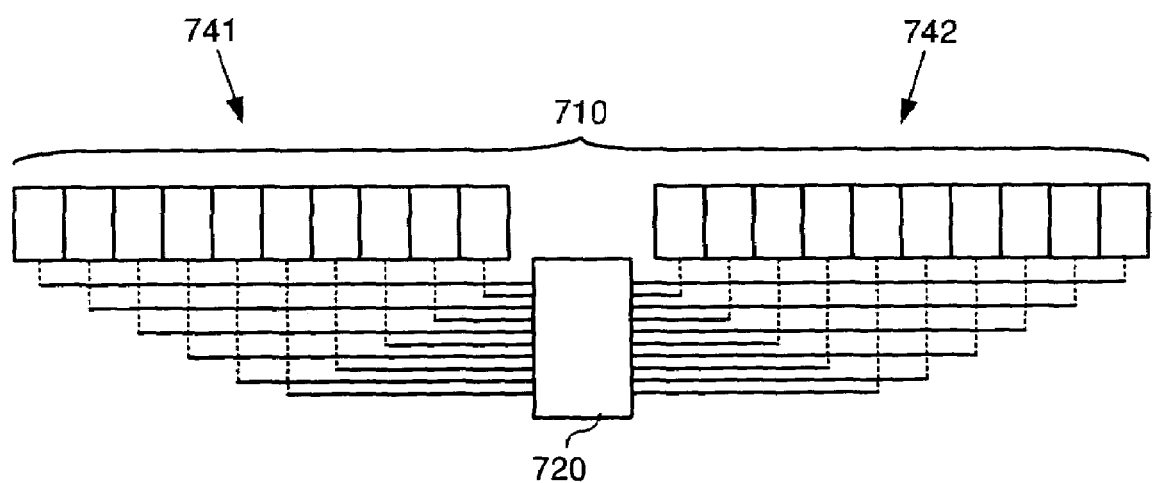
FIG. 7 is a diagram illustrating a circuit having signal lines positioned according to another alternative embodiment.

Another example of an alternative component topology is illustrated in FIG. 7. In this figure, the second component (720) is positioned at the center of the linear array of first components (710,) rather than at the end of the array. The signal lines coupling the first components to the second component are connected to opposite sides of the second component. In this embodiment, the parallel portions on each side of the second component are staggered in accordance with the foregoing description. This configuration can alternatively be viewed as consisting of two separate linear arrays of the first components (741, 742,) where the second component is positioned at the end of each of these two linear arrays.

Figure 8:
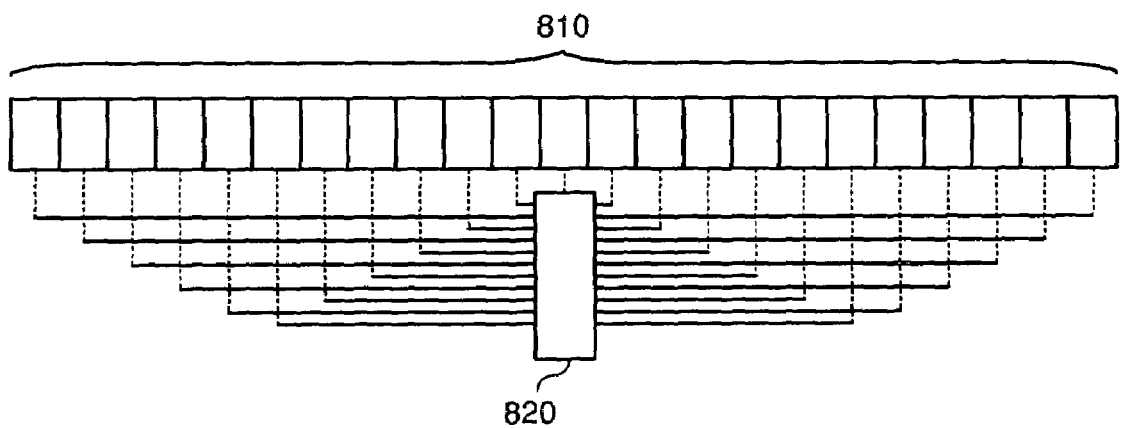
FIG. 8 is a diagram illustrating a circuit having signal lines positioned according to yet another alternative embodiment.

Referring to FIG. 8, another alternative component topology is illustrated. In this figure, the second component (820) is again positioned centrally with respect to the linear array of first components (810,) rather than at the end of the array. (It should be noted that second components 720 and 820 need not be positioned exactly at the center of the respective linear arrays of first components 710 and 810.) In contrast to FIG. 7, the linear array of first components is contiguous, rather than being broken into two separate linear arrays. The signal lines coupling the first components to the second component are connected to the nearest sides of the second component. The parallel portions on each side of the second component are staggered in this embodiment in accordance with the foregoing description.

Another alternative embodiment of the invention may comprise an electronic design automation tool. It is common in the design and layout of integrated circuits to such tools to automate activities such as the routing of traces (wires) between components of the circuits. These tools may consist of program instructions (software code) that, when executed, generate circuit component interconnections that include staggered wiring layouts in accordance with the present disclosure. Such software tools are contemplated to be embodiments of the invention. These software tools may be embodied in various computer-readable media. Likewise, computer systems that execute such software tools are considered to be embodiments of the invention that are within the scope of the present disclosure.

It should be noted that, while the embodiments described herein position the longest parallel portion adjacent to the shortest portion in order to achieve the greatest capacitance reduction in the signal line that has the highest capacitance, this is not necessary in all embodiments. Alternative embodiments may be staggered with various ones of the short parallel portions positioned between the long parallel portions to achieve varying degrees of capacitance reduction. These alternative embodiments are contemplated to be within the scope of the invention as set forth in the claims below.

Those of skill in the art will understand that information and signals may be represented using any of a variety of different technologies and techniques. For example, data, instructions, commands, information, signals, bits, symbols, and the like that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

The various illustrative logical blocks, modules, and circuits described in connection with the embodiments disclosed herein may be implemented or performed with application specific integrated circuits (ASICs), field programmable gate arrays (FPGAs), memory circuits, general purpose processors, digital signal processors (DSPs) or other logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of methods or algorithms described in connection with the embodiments disclosed herein may be embodied directly in hardware, in software (program instructions) executed by a processor, or in a combination of the two. Software may reside in RAM memory, flash memory, ROM memory, EPROM memory, EEPROM memory, registers, hard disk, a removable disk, a CD-ROM, or any other form of computer-readable media known in the art. Such media containing program instructions that embody one of the present methods are themselves alternative embodiments of the invention. One exemplary storage medium may be coupled to a computing system (e.g., a processor,) such that the processor can read information from, and write information to, the storage medium. In the alternative, the storage medium may be integral to the processor. The processor and the storage medium may reside, for example, in an ASIC. The ASIC may reside in a user terminal. The processor and the storage medium may alternatively reside as discrete components in a user terminal or other device.

"Computer" and "computing system," as used herein, are intended to include any type of data processing or instruction processing system capable of performing the functions described herein. "Computer-readable media," as used herein, refers to media that can store program instructions that can be executed by a computing system, and includes floppy disks, hard disk drives, CD-ROMs, DVD-ROMs, RAM, ROM, DASD arrays, magnetic tapes, floppy diskettes, optical storage devices and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A system comprising:
   a linear array of first components;
   a second component positioned adjacent to the linear array of first components; and
   a plurality of signal lines;
   wherein each signal line is coupled between a corresponding one of the first components and the second component;
   wherein each signal line includes a parallel portion that is parallel to the linear array of first components;
   wherein the parallel portion of each signal line has a corresponding length; and
   wherein the signal lines are positioned in a series with adjacent signal lines alternately having long and short parallel portion, where long parallel portions have lengths greater than a median length of the parallel portions and short parallel portions have lengths less than the median length of the parallel portions.

2. The system of claim 1, wherein the second component is positioned at one end of the linear array of first components.

3. The system of claim 1, wherein the second component is positioned centrally with respect to the linear array of first components.

4. The system of claim 1, wherein the signal lines are arranged with the signal line having the longest parallel portion is adjacent to the signal line having the shortest parallel portion.

5. The system of claim 4, wherein the signal lines are arranged with the signal line having the nth longest parallel portion is adjacent to the signal line having the nth shortest parallel portion.

6. The system of claim 5, wherein the signal lines include a set of long lines having parallel portion lengths greater than or equal to a median length and a set of short lines having parallel portion lengths less than or equal to a median length; wherein the parallel portions are arranged in a series in which the lengths of the long set of parallel portions increase and the lengths of the short set of parallel portions decrease.

7. The system of claim 5, wherein the signal lines include a set of long lines having parallel portion lengths greater than or equal to a median length and a set of short lines having parallel portion lengths less than or equal to a median length; wherein the parallel portions are arranged in a series in which longer ones of the long parallel portions and shorter ones of the short parallel portions are positioned farthest from the center of the series.

8. The system of claim 5, wherein the nth longest parallel portion and the (n+1)th longest parallel portion are physically separated by a single parallel portion that is shorter than the nth and (n+1)th longest parallel portions.

9. The system of claim 5, wherein the nth longest parallel portion and the (n+2)th longest parallel portion are physically separated by a single parallel portion that is shorter than the nth and(n+2)th longest parallel portions.

10. The system of claim 1, wherein the system is implemented in an error correction circuit.

11. A method comprising:
providing a linear array of first components;
providing a second component positioned adjacent to the linear array of first components; and
providing a plurality of signal lines;
wherein each signal line is coupled between a corresponding one of the first components and the second component;
wherein each signal line includes a parallel portion that is parallel to the linear array of first components;
wherein the parallel portion of each signal line has a corresponding length; and
wherein the signal lines are positioned in a series with adjacent signal lines alternately having long and short parallel portion, where long parallel portions have lengths greater than a median length of the parallel portions and short parallel portions have lengths less than the median length of the parallel portions.

12. The method of claim 11, wherein the second component is positioned at one end of the linear array of first components.

13. The method of claim 11, wherein the second component is positioned centrally with respect to the linear array of first components.

14. The method of claim 11, further comprising arranging the signal lines with the signal line having the longest parallel portion adjacent to the signal line having the shortest parallel portion.

15. The method of claim 14, further comprising arranging the signal lines with the signal line having the nth longest parallel portion adjacent to the signal line having the nth shortest parallel portion.

16. The method of claim 15, further comprising arranging the signal lines with the nth longest parallel portion and the (n+1)th longest parallel portion physically separated by a single parallel portion that is shorter than the nth and (n+1)th longest parallel portions.

17. The method of claim 15, further comprising arranging the signal lines with the nth longest parallel portion and the (n+2)th longest parallel portion physically separated by a single parallel portion that is shorter than the nth and (n+2)th longest parallel portions.

18. The method of claim 11, wherein the method is implemented in an error correction circuit.

19. A design automation tool comprising one or more program instructions embodied in a computer-readable medium, wherein the program instructions are configured to cause a computing system to perform the method comprising:
positioning a linear array of first components;
positioning a second component adjacent to the linear array of first components; and
positioning a plurality of signal lines coupled between the first components and the second component,
wherein each signal line includes a parallel portion that is parallel to the linear array of first components;
wherein the parallel portion of each signal line has a corresponding length; and
wherein the signal lines are positioned in a series with adjacent signal lines alternately having long and short parallel portion, where long parallel portions have lengths greater than a median length of the parallel portions and short parallel portions have lengths less than the median length of the parallel portions.

* * * * *